(12) United States Patent
Das et al.

(10) Patent No.: US 10,923,363 B1
(45) Date of Patent: Feb. 16, 2021

(54) METHOD FOR INCREASING PATTERN DENSITY ON A WAFER

(71) Applicant: Tokyo Electron Limited, Tokyo (JP)

(72) Inventors: Sanjana Das, Hillsboro, OR (US); Anton J. deVilliers, Clifton Park, NY (US); Daniel Fulford, Cohoes, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/529,972

(22) Filed: Aug. 2, 2019

(51) Int. Cl.
  *H01L 21/3213* (2006.01)
  *H01L 21/033* (2006.01)

(52) U.S. Cl.
  CPC .... *H01L 21/32137* (2013.01); *H01L 21/0337* (2013.01); *H01L 21/0338* (2013.01)

(58) Field of Classification Search
  None
  See application file for complete search history.

(56) References Cited

U.S. PATENT DOCUMENTS

| | | | |
|---|---|---|---|
| 7,892,982 B2 | 2/2011 | Lee et al. | |
| 9,263,297 B2 * | 2/2016 | deVilliers | H01L 21/32139 |
| 10,014,175 B2 * | 7/2018 | Chang | H01L 21/30604 |
| 2014/0291735 A1 | 10/2014 | Shen et al. | |
| 2015/0214070 A1 * | 7/2015 | deVilliers | H01L 21/32115 438/697 |
| 2015/0243519 A1 | 8/2015 | deVilliers | |

FOREIGN PATENT DOCUMENTS

| | | | |
|---|---|---|---|
| CN | 101783390 B | * | 5/2013 |
| KR | 10-0790998 B1 | | 1/2008 |

OTHER PUBLICATIONS

International Search Report and Written Opinion dated Oct. 13, 2020 in PCT/US2020/040053, citing documents AA-AC and AO therein, 11 pages.

* cited by examiner

*Primary Examiner* — Allan W. Olsen
(74) *Attorney, Agent, or Firm* — Oblon, McClelland, Maier & Neustadt, L.L.P.

(57) ABSTRACT

Techniques herein include a method of patterning semiconductor wafers with improved line edge roughness (LER) and/or line width roughness (LWR), including lines below 12 nm in width. An initial bilayer mandrel is formed. The top layer is trimmed to a particular ratio. A reversal material protects uncovered portions of the lower layer, while a central portion is removed, resulting in two mandrels, each one fifth the initial mandrel width. The resulting mandrels are transferred into two underlying layers to form second bilayer mandrels. Sidewall spacers are formed on the second bilayer mandrels, and a fill material can fill remaining spaces. A planarization step can planarize the substrate to a bottom layer of the second bilayer mandrels, which results in a multi-line layer having square profile lines at 1:1 spacing ratio without spacer rounding.

20 Claims, 14 Drawing Sheets

METHOD FOR INCREASING PATTERN DENSITY ON A WAFER

BACKGROUND OF THE INVENTION

This disclosure relates to substrate processing, and, more particularly, to techniques for patterning substrates including patterning of semiconductor wafers.

Methods of shrinking line-widths in lithographic processes have historically involved using greater-NA (numerical aperture) optics, shorter exposure wavelengths, or interfacial media other than air (e.g., water immersion). As the resolution of traditional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material (such as photoresist) to a surface of a substrate. This radiation-sensitive material is transformed into a relief pattern (patterned mask) that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This patterned mask may comprise multiple sub-layers.

SUMMARY

Semiconductor technologies are continually progressing to smaller feature sizes of 14 nanometers and below. The continual reduction in sizes of features from which the foregoing elements are fabricated places ever-greater demands on techniques used to form the features. The concept of "pitch" can be used to describe the sizing of these features. Pitch is the distance between two identical points in two adjacent repetitive features.

Pitch reduction techniques, often somewhat erroneously termed "pitch multiplication" as exemplified by "pitch doubling" and "pitch quadrupling," can extend the capabilities of photolithography beyond feature size limitations (exposure limitations). That is, conventional "multiplication" of pitch by a certain factor actually involves reducing the pitch by that factor. Double patterning techniques (DPT) with 193 nm immersion lithography are being thought to be one of the most promising candidates for the 22 nm node and beyond. Especially because self-aligned spacer double patterning (SADP) has already been established as a pitch doubling process and adapted in high volume manufacturing of NAND flash memory devices. Moreover, ultra-fine resolution can be obtained to repeat the SADP step twice as pitch quadrupling. The introduction of the reversal layer enables forming a fine trench pattern and hole pattern. Here the initial pattern is obtained by X-Y double line exposures. Then, the reversal material is applied on the initial pattern and subsequent etching process converts the initial trench pattern to line.

One embodiment includes a method of patterning a substrate. A substrate is received having a first relief pattern positioned on a stack of underlying layers. The first relief pattern includes linear structures having three layers of material. The three layers of material include a layer of photoresist positioned on an anti-reflective coating layer. The anti-reflective coating layer is positioned on a third layer. The linear structures can have a first pitch that has a line-to-space ratio of 5:3. An etch operation selectively etches the layer of photoresist only resulting in the layer of photoresist being laterally etched from an initial width of lines to a resulting width of lines equal to three fifths of an initial width of lines of photoresist. A fill material fills spaces between structures of the first relief pattern, covers horizontal top surfaces of the anti-reflective coating layer, and leaves top surfaces of the layer of photoresist uncovered. A second etch operation is executed that removes the layer of photoresist and anisotropically etches uncovered portions of the anti-reflective coating layer and the third layer. The fill material is removed from the substrate. A pattern defined by remaining portions of the third layer is transferred into a fourth layer and into a fifth layer, using the third layer and second layer as an etch mask. The fourth layer is positioned below the third layer, and the fifth layer positioned below the fourth layer. This pattern transfer results in the fourth layer and the fifth layer forming bi-layer mandrels. Sidewall spacers are then formed on the bi-layer mandrels. A second fill material can be deposited on the substrate that at least partially fills spaces defined between the sidewall spacers on the bi-layer mandrels. The substrate is then planarized by removing the fourth layer and removing material from the sidewall spacers and the second fill material down to a top surface of the fifth layer such that a multi-line layer is formed having a planar surface at the top surface of the fifth layer and having lines with a 1:1 ratio.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include a method of patterning semiconductor wafers with improved line edge roughness (LER) and/or line width roughness (LWR), even applicable to lines below 12 nm in width. An initial bilayer mandrel is formed. The top layer is trimmed to a particular ratio. A reversal material protects uncovered portions of the lower layer, while a central portion is removed, resulting in two mandrels, each one fifth the initial mandrel width. The resulting mandrels are transferred into two underlying layers to form second bilayer mandrels. Sidewall spacers are formed on the second bilayer mandrels, and a fill material can fill remaining spaces. A planarization step can planarize the substrate to a bottom layer of the second bilayer mandrels, which results in a multi-line layer having square profile lines at 1:1 spacing ratio without spacer rounding.

Figure 1:
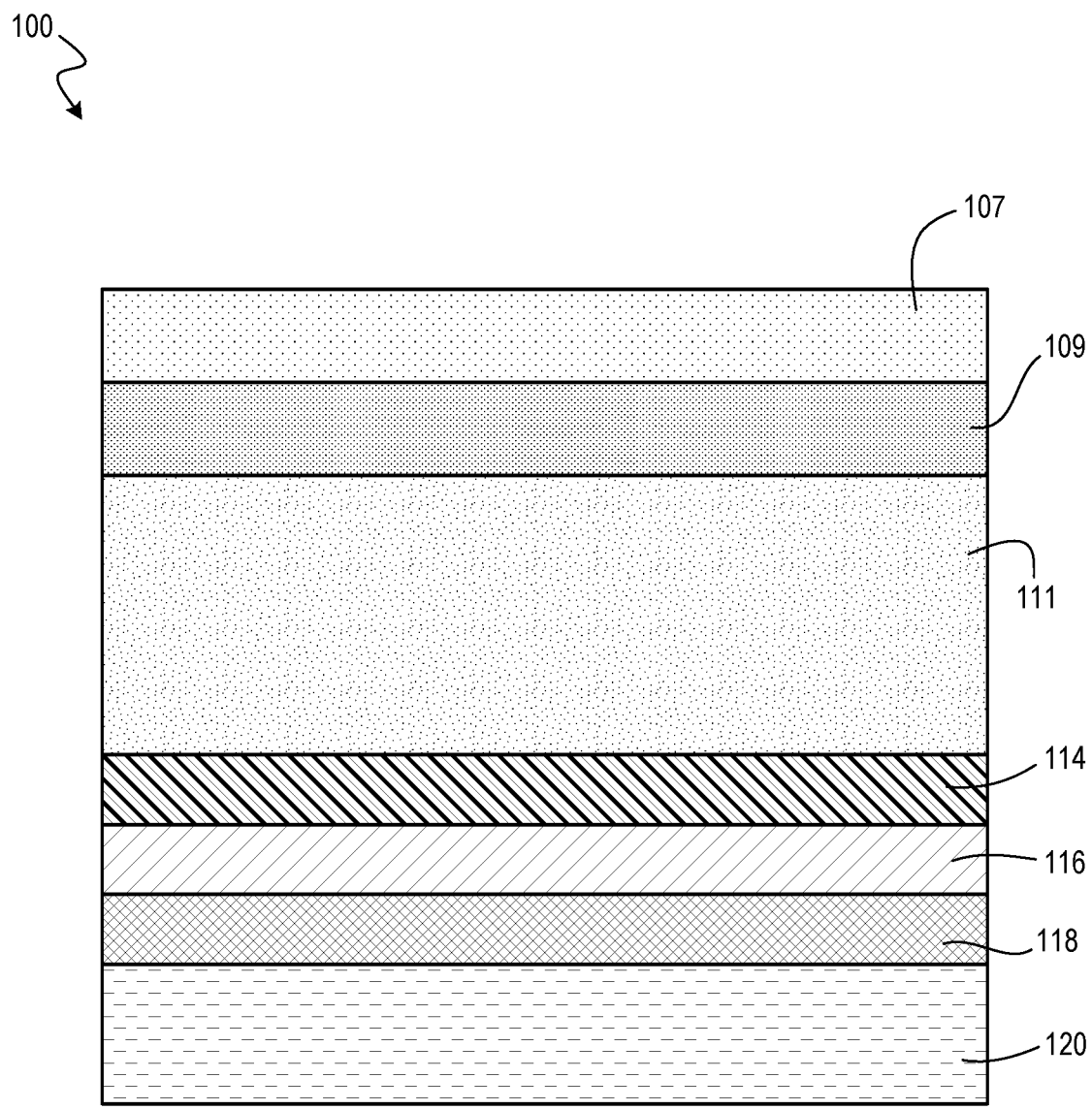
FIG. 1 is a cross-sectional view of an example substrate segment showing a process flow according to embodiments disclosed herein.

Embodiments herein include substrate processing techniques to pattern substrates for microfabrication. Referring to FIG. 1, a substrate layer stack is prepared on substrate 100. Layers within the substrate stack can be of various materials and thicknesses, as well as having different etch resistivities. Substrate 100 includes layer 107, layer 109, layer 111, layer 114, layer 116, layer 118, and layer 120. Layer 107 can be a layer of photoresist. Layer 109 can be a bottom anti-reflective coating. Layer 111 can be amorphous carbon. Layer 114 can be a hardmask material. Layer 116 and layer 118 can be additional memorization layers. Layer 120 can be poly silicon. The various layers can be deposited by chemical vapor deposition (CVD), physical vapor deposition (PVD), spin-on deposition, or any other deposition technique. Different substrate stacks can have various arrangements of layers and thicknesses depending on design objectives.

Figure 2:
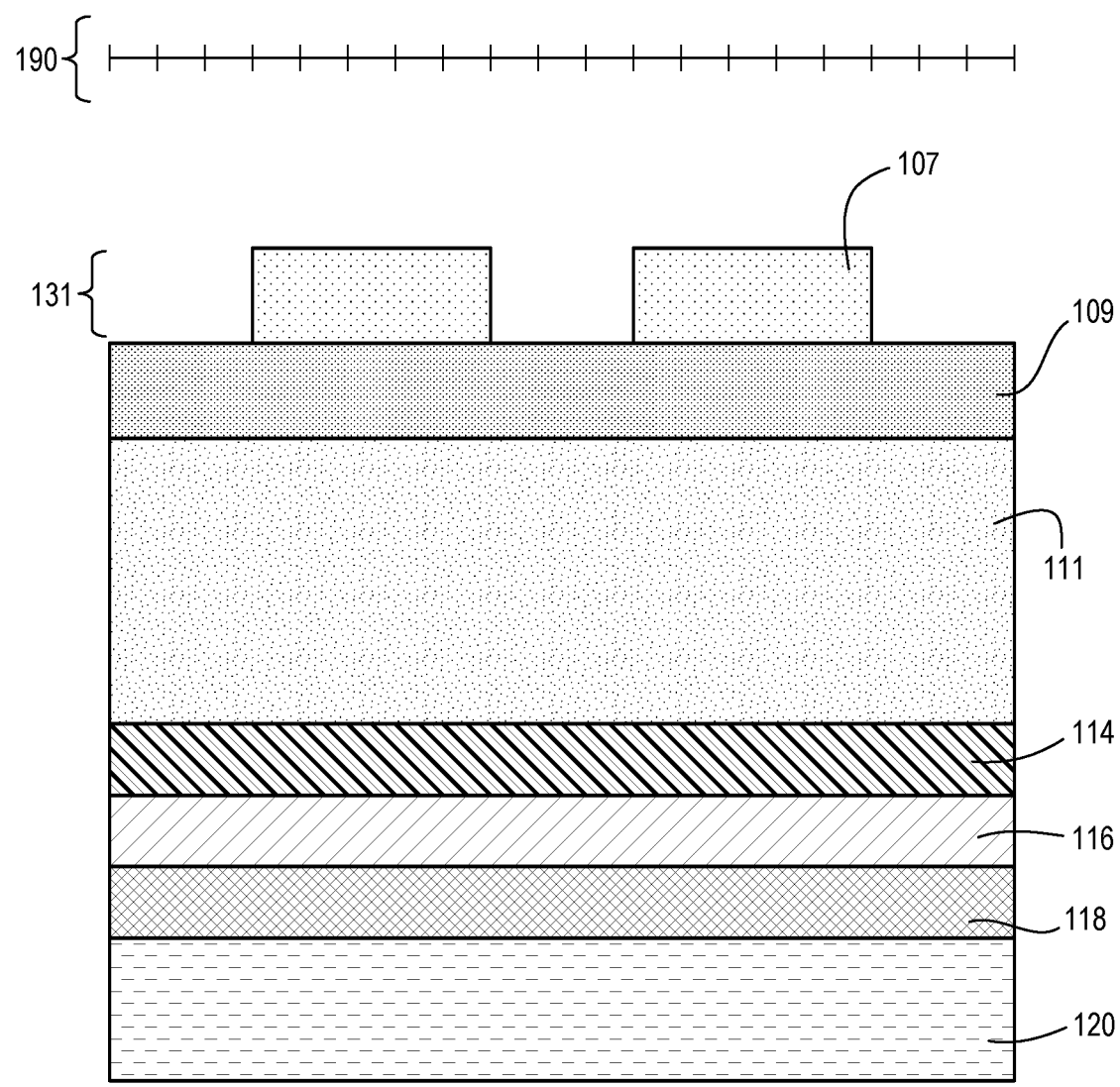
FIG. 2 is a cross-sectional view of an example substrate segment showing a process flow according to embodiments disclosed herein.

The layer of photoresist is then exposed to a pattern of actinic radiation, which creates a latent pattern in the layer of photoresist. The layer of photoresist is developed, such as by using negative tone developer, and this results in relief pattern 131 of photoresist, as illustrated in FIG. 2. This relief pattern can include lines or structures having a 5:3 pitch. By way of a non-limiting example, the latent pattern can be obtained by using an X-Y double line dipole exposure on a negative tone develop photoresist. FIG. 2 and remaining figures include scale 190, which shows a simplified, relative scale of lines and spaces.

Figure 3:
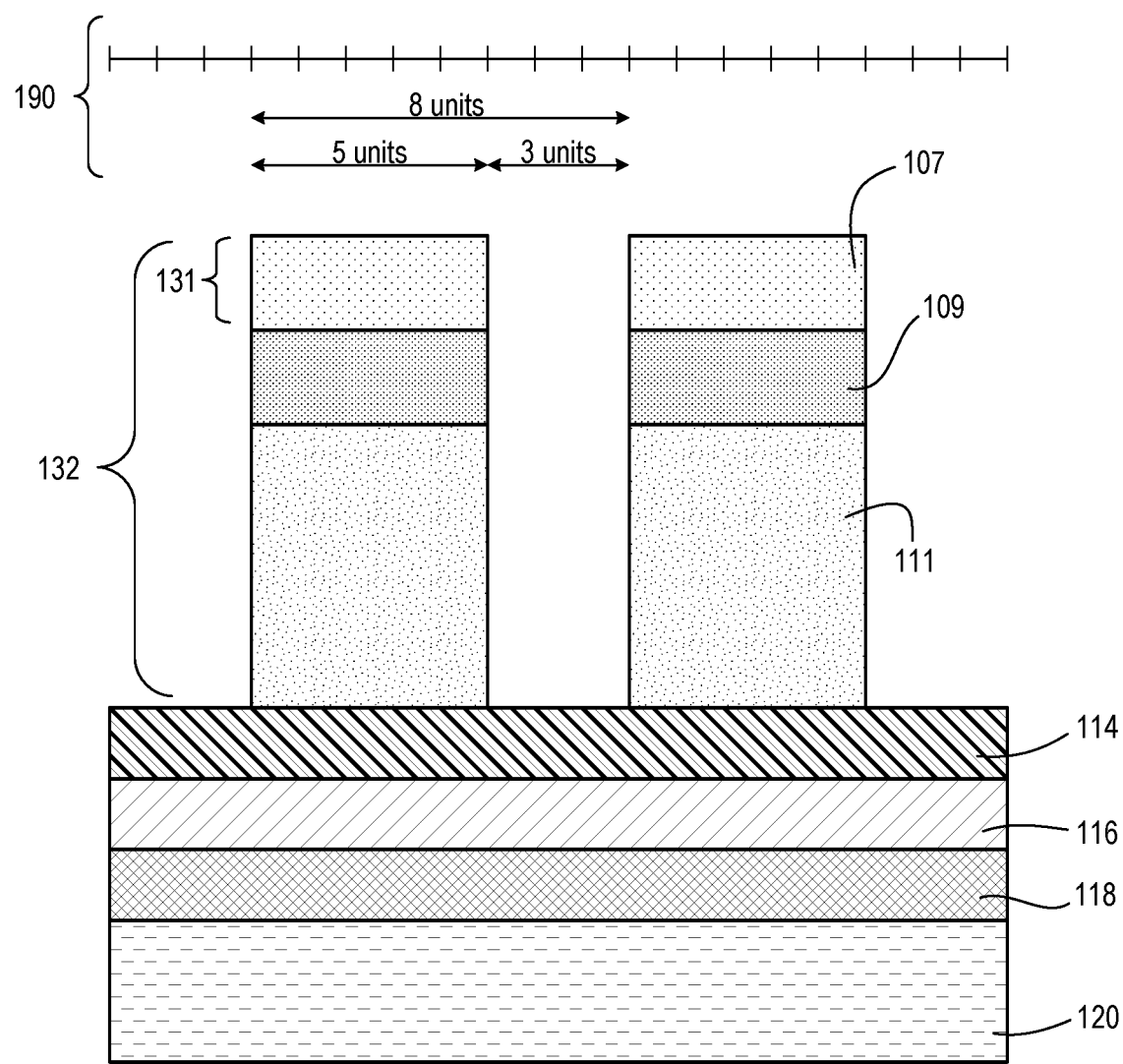
FIG. 3 is a cross-sectional view of an example substrate segment showing a process flow according to embodiments disclosed herein.

The photoresist relief pattern is then transferred to one or more underlying layers. The relief pattern functions as an etch mask for anisotropically etching underlying layers, such as with plasma-based etchants. This can include pattern transfer to a layer of anti-reflective coating, SiON, amorphous carbon, et cetera. A reactive-ion etching (RIE) process can be used to transfer the photoresist relief pattern into an anti-reflective coating layer, and into a planarization film such as an amorphous carbon layer. An example result is shown in FIG. 3, in which the photoresist relief pattern has been transferred into layer 109 and layer 111, resulting in relief pattern 132. As can be seen with scale 190, relief pattern 132 has a pitch of 8 units, which has a line-to-space ratio of 5:3 in that lines have a cross-sectional line width of five units while spaces have a cross-sectional space width of three units.

Figure 4:
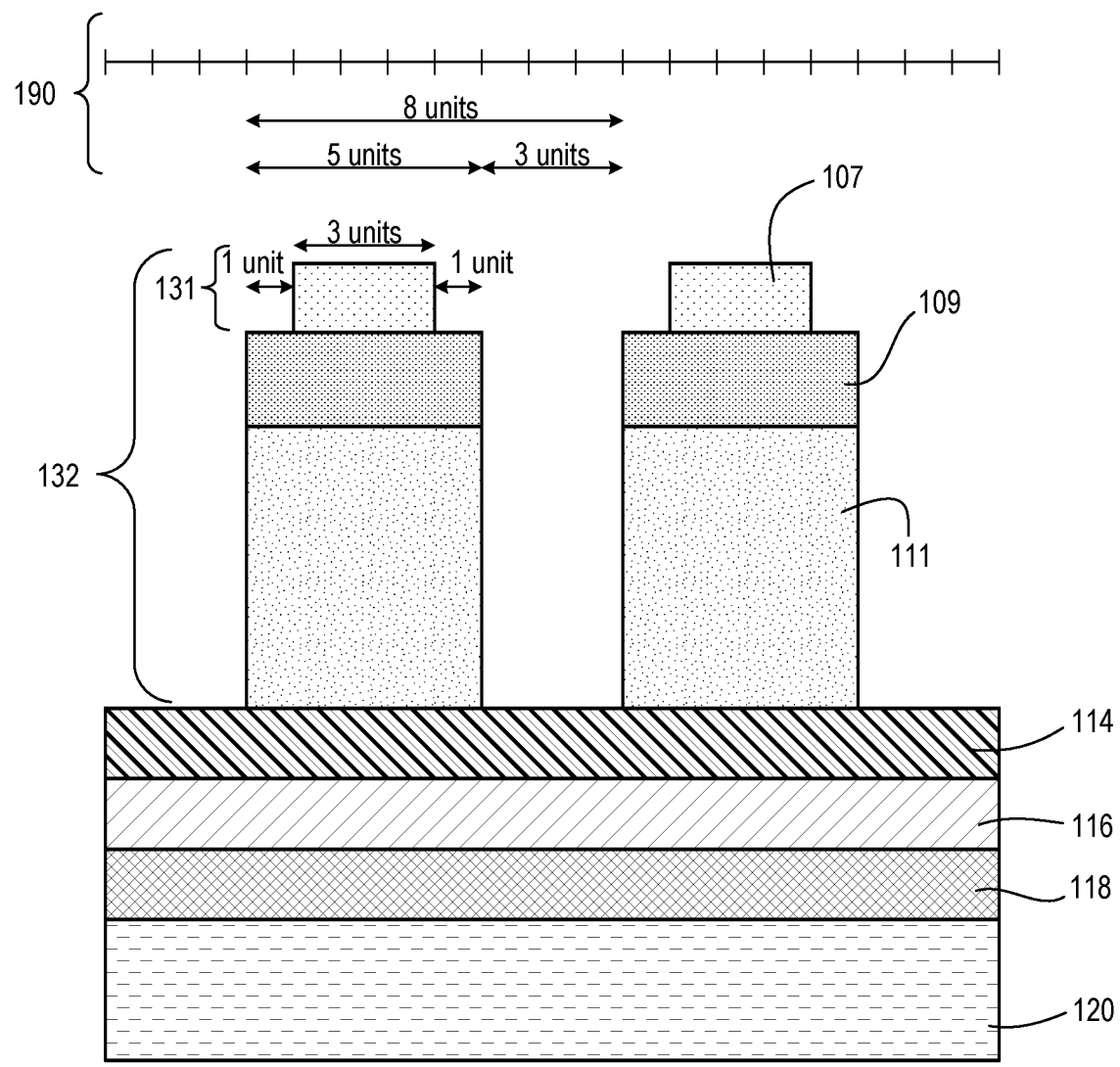
FIG. 4 is a cross-sectional view of an example substrate segment showing a process flow according to embodiments disclosed herein.

Next, the relief pattern of photoresist is trimmed from an initial width to a modified width that is smaller than the initial width. By way of a non-limiting example, the photoresist can be trimmed to three fifths (⅗) of an initial width. FIG. 4 illustrates lines of photoresist that were initially 5 units in width, but have been trimmed to 3 units of width. This trimming of the first layer can be executed using an isotropic etch selective to the photoresist, in that the etch chemistry does not significantly etch the ARC coating, the amorphous carbon layer, and the hardmask floor, which could be silicon nitride (SiN), TiN, et cetera.

Figure 5:
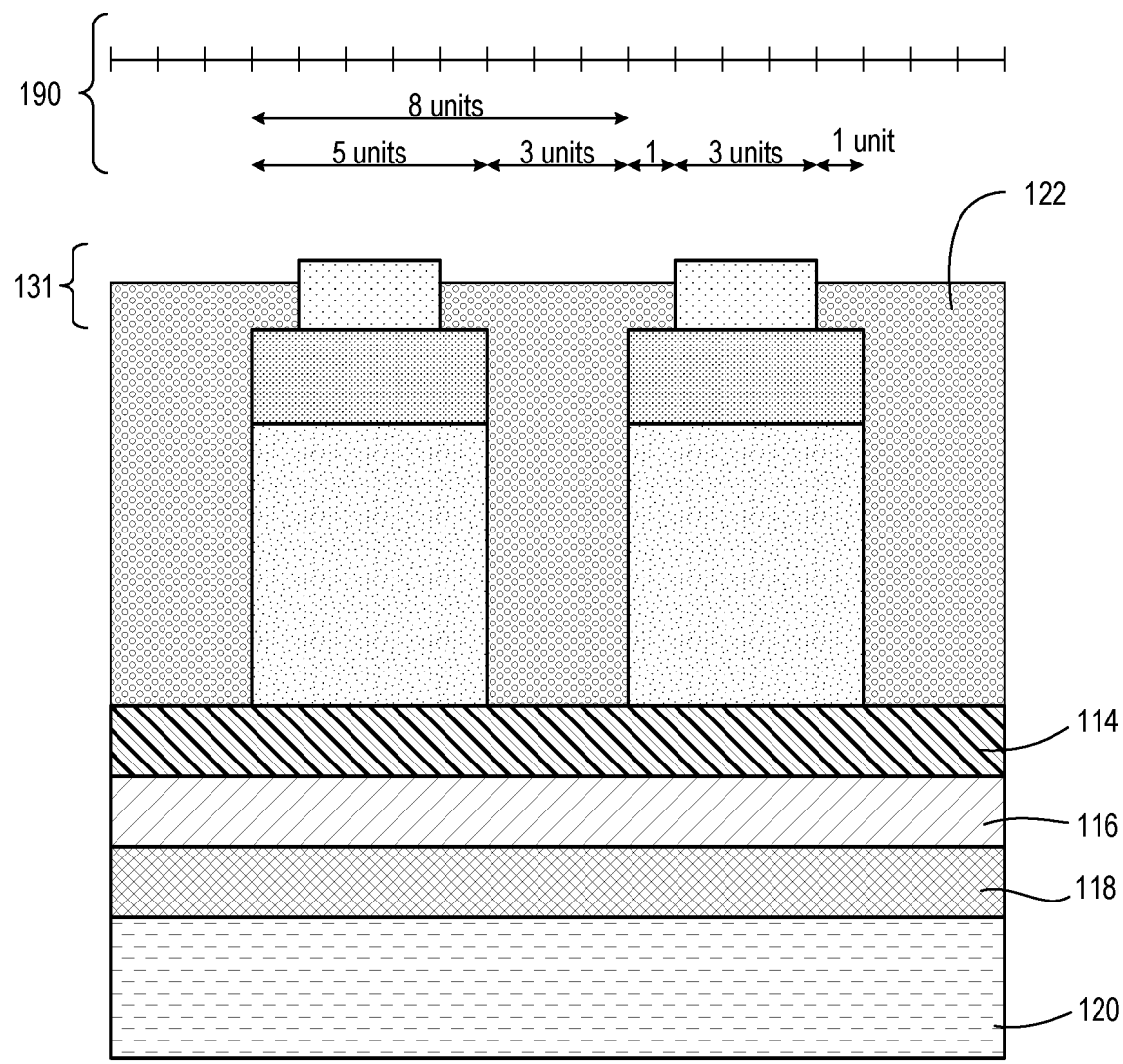
FIG. 5 is a cross-sectional view of an example substrate segment showing a process flow according to embodiments disclosed herein.

Referring now to FIG. 5, a fill material 122 is deposited on the substrate to function as a reversal material or reversal layer. The substrate 100 can be coated with the fill material 122 using various deposition techniques. If deposition of the fill material results in an overburden then a top portion of the fill material can be etched back uniformly or otherwise planarized until uncovering the relief pattern 131. Another option for planarization is a diffusion-limited solubility shifting process. The fill material can be recessed below a top surface of the photoresist relief pattern. For example an acid or solubility-shifting agent is deposited on top of the fill material and diffused vertically down into developable fill material, which makes the diffused portion/thickness soluble or soluble after a bake step. Subsequently, the soluble top portion can be developed and removed, uncovering the relief pattern of photoresist. The fill material can nevertheless cover the first underlying layer in areas where the photoresist relief pattern was trimmed. A silicon-containing developable bottom anti-reflective coating (Si-DBARC) can be used as the fill material.

Figure 6:
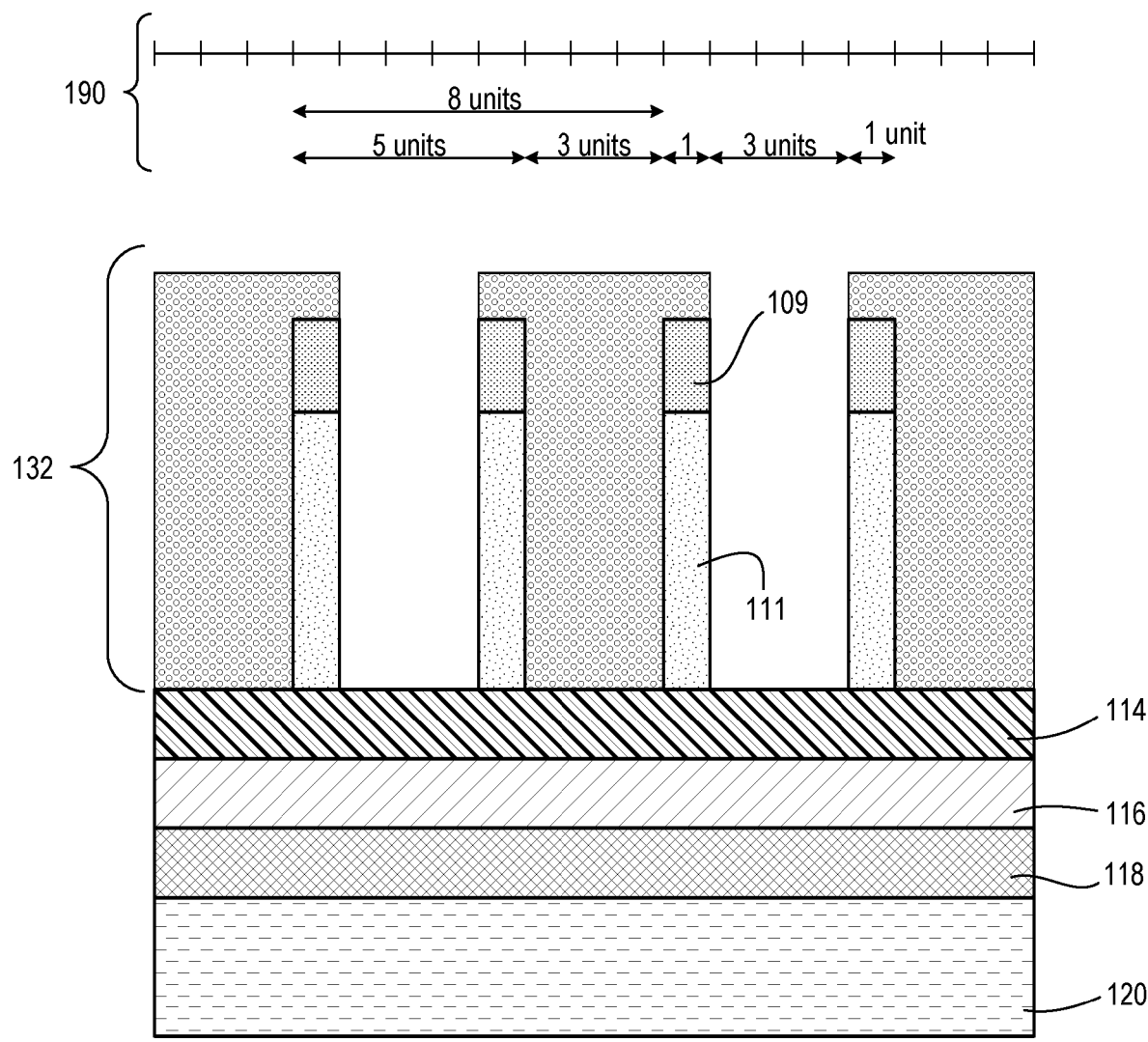
FIG. 6 is a cross-sectional view of an example substrate segment showing a process flow according to embodiments disclosed herein.

A third etch step is then executed. This third etch step is directional and selective. The fill material resists being etched, while the photoresist is etched as well as uncovered portions of the second layer (layer 109) and the third layer (layer 111) underlying the photoresist. Note that different etch chemistries can be used to target each individual layer. Thus, the third etch step my comprise three individual etch operations. The photoresist can be removed using an ashing step. Note also that other layers including interfacial layers can be used. Any interfacial layer between layer 107 and 109, and 109 and 111 can be etched in turn. Note that the fill material 122 functions as an etch mask, covering and protecting a portion of the relief pattern 132. This process essentially turns a line pattern into a trench pattern as an opening or trench is formed within each line of the relief pattern 132. FIG. 6 illustrates an example result.

Figure 7:
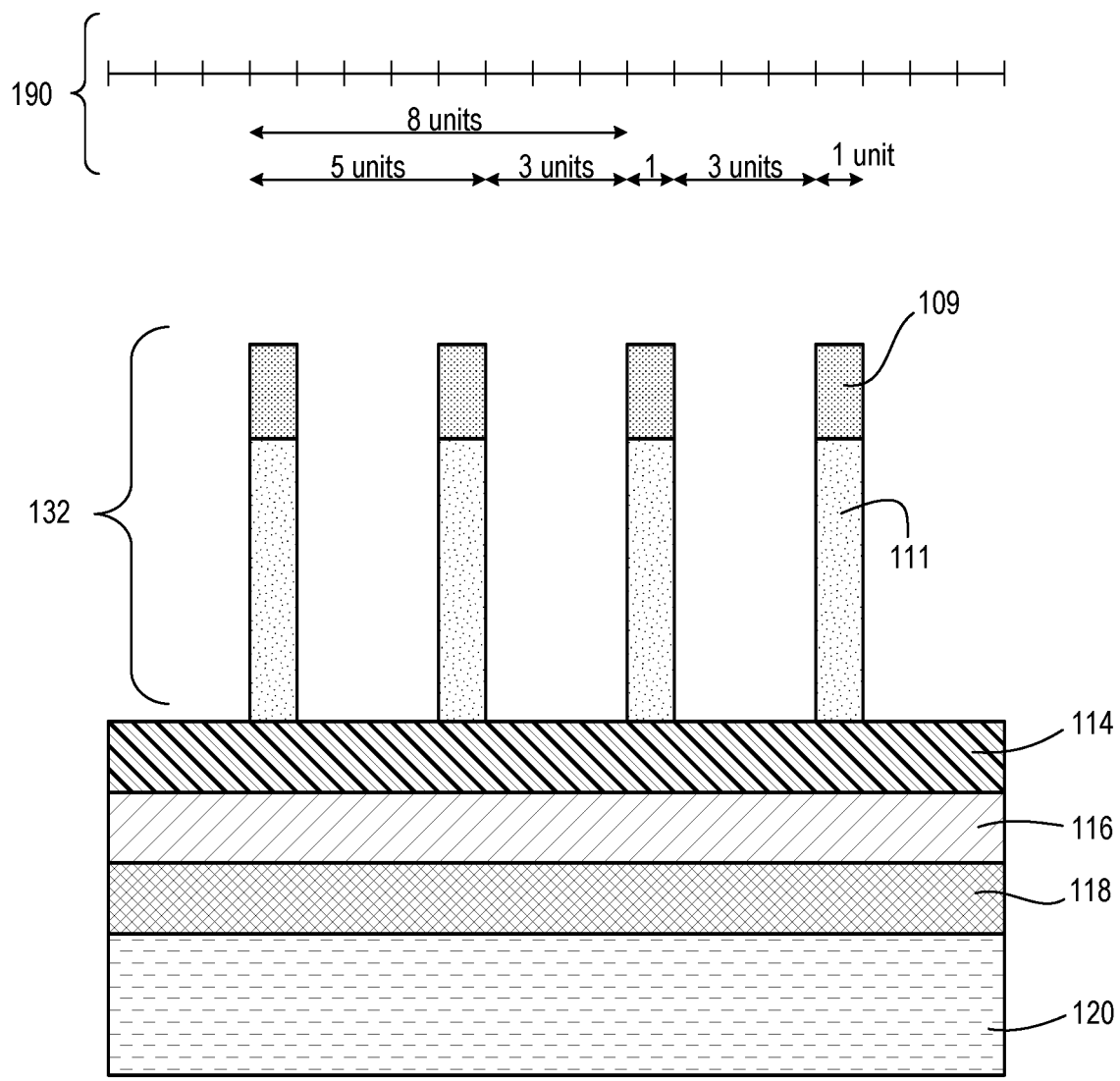
FIG. 7 is a cross-sectional view of an example substrate segment showing a process flow according to embodiments disclosed herein.

The fill material 122 can then be removed with a selective plasma etch, wet etch, or developing chemistry. FIG. 7 illustrates an example result. The resulting lines or structures now have a width that is one fifth (⅕) of the initial thickness of photoresist lines. Thus, each initial mandrel of five units in length was split into two mandrels of one unit length, with a three unit space between each new line.

Figure 8:
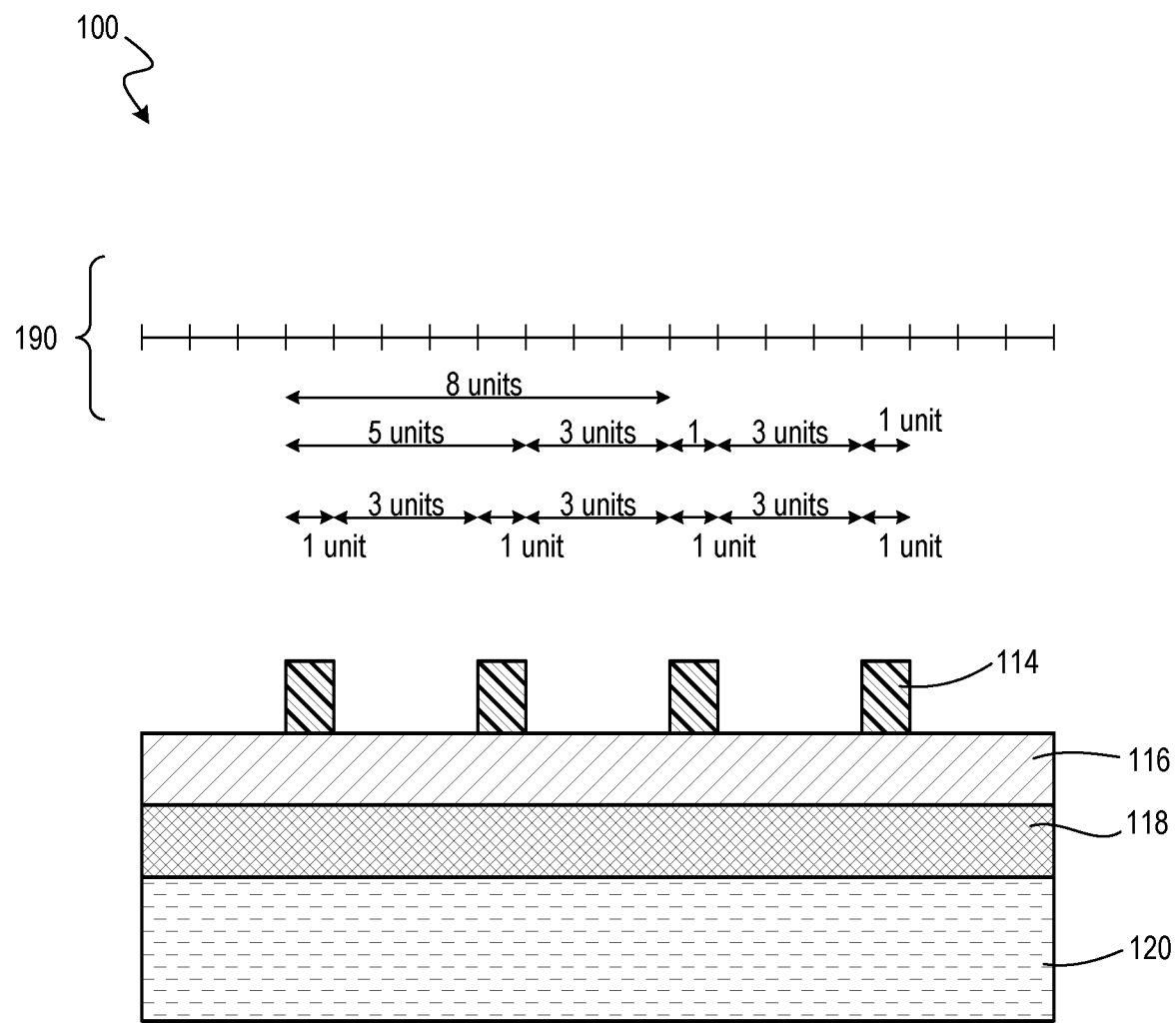
FIG. 8 is a cross-sectional view of an example substrate segment showing a process flow according to embodiments disclosed herein.

The remaining (narrowed) structures can then be used as an etch mask to transfer into layer 114, which can be a hardmask layer (amorphous carbon, SiN, et cetera). Remaining structures from relief pattern 132 can then be removed. An example result is shown in FIG. 8. The result can include a pattern of lines having a new pitch of 4 units, with lines having a width of one unit while spaces have a width of three units. The line-to-space ratio is thus 1:3. At this point, any of various microfabrication steps can then be continued. For example, the new lines formed in the hardmask material can be used as a mandrel in a self-aligned double patterning (SADP) process.

Figure 9:
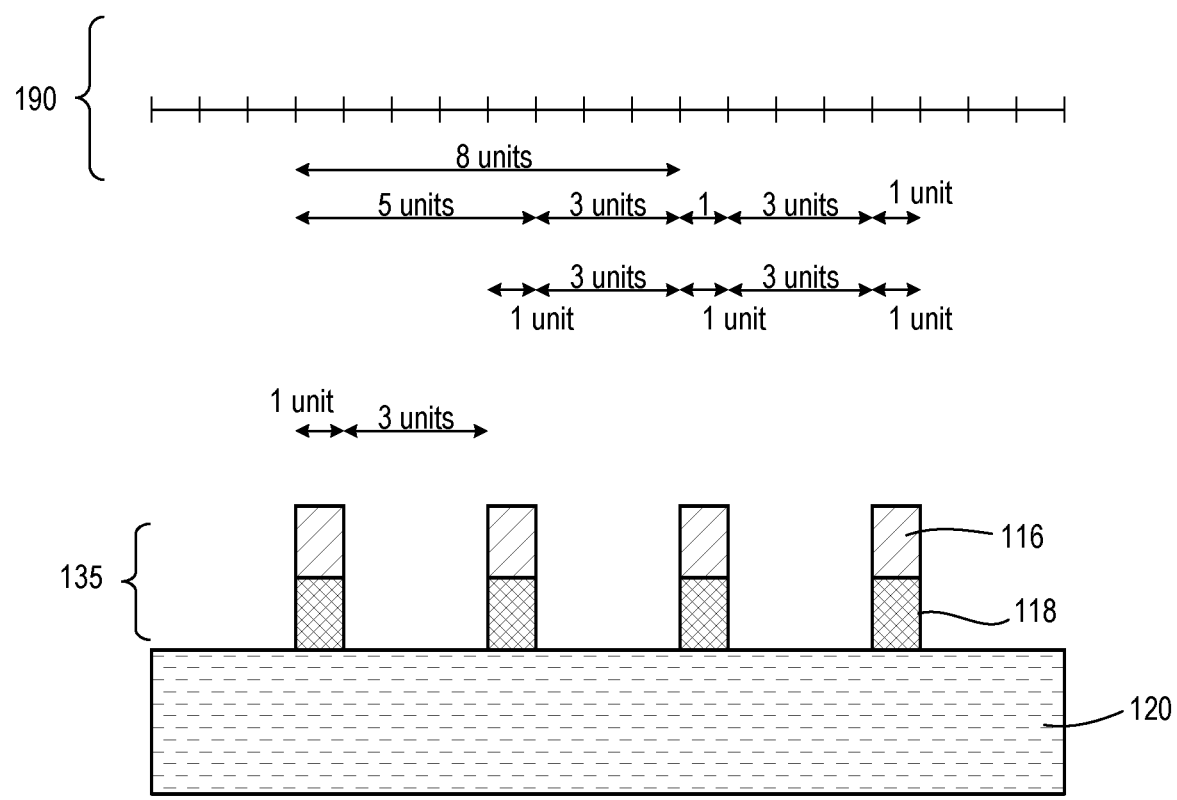
FIG. 9 is a cross-sectional view of an example substrate segment showing a process flow according to embodiments disclosed herein.

In additional steps, the resulting pattern is transferred into an underlying layer, which can include two underlying layers (layer 116 and layer 118). The etch mask of layer 114 can then be removed. An example result is illustrated in FIG. 9. Note that relief pattern 135 includes lines that form a bilayer mandrel.

Figure 10:
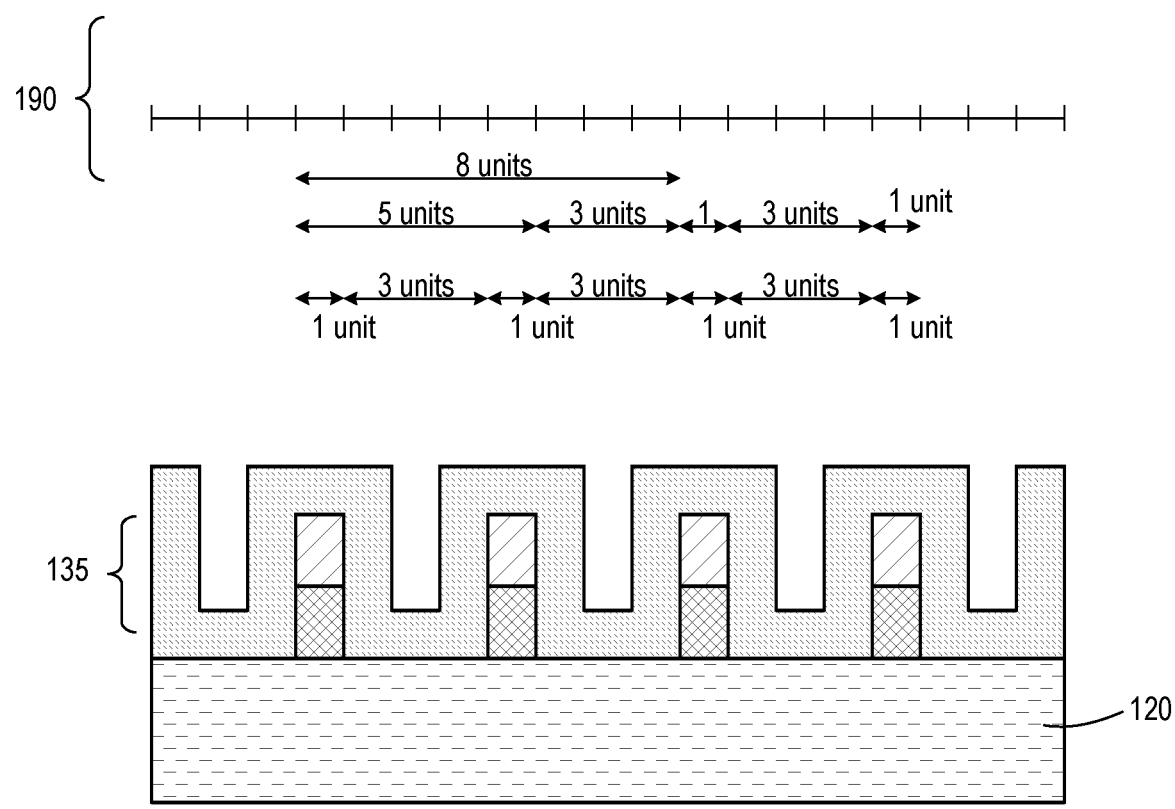
FIG. 10 is a cross-sectional view of an example substrate segment showing a process flow according to embodiments disclosed herein.

The bilayer mandrels can then be used for sidewall spacer formation. For example, a conformal deposition is executed, such as an ALD oxide conformal coat. An example result is shown in FIG. 10. This conformal coat deposits a film of approximately equal thickness on all surfaces.

Figure 11:
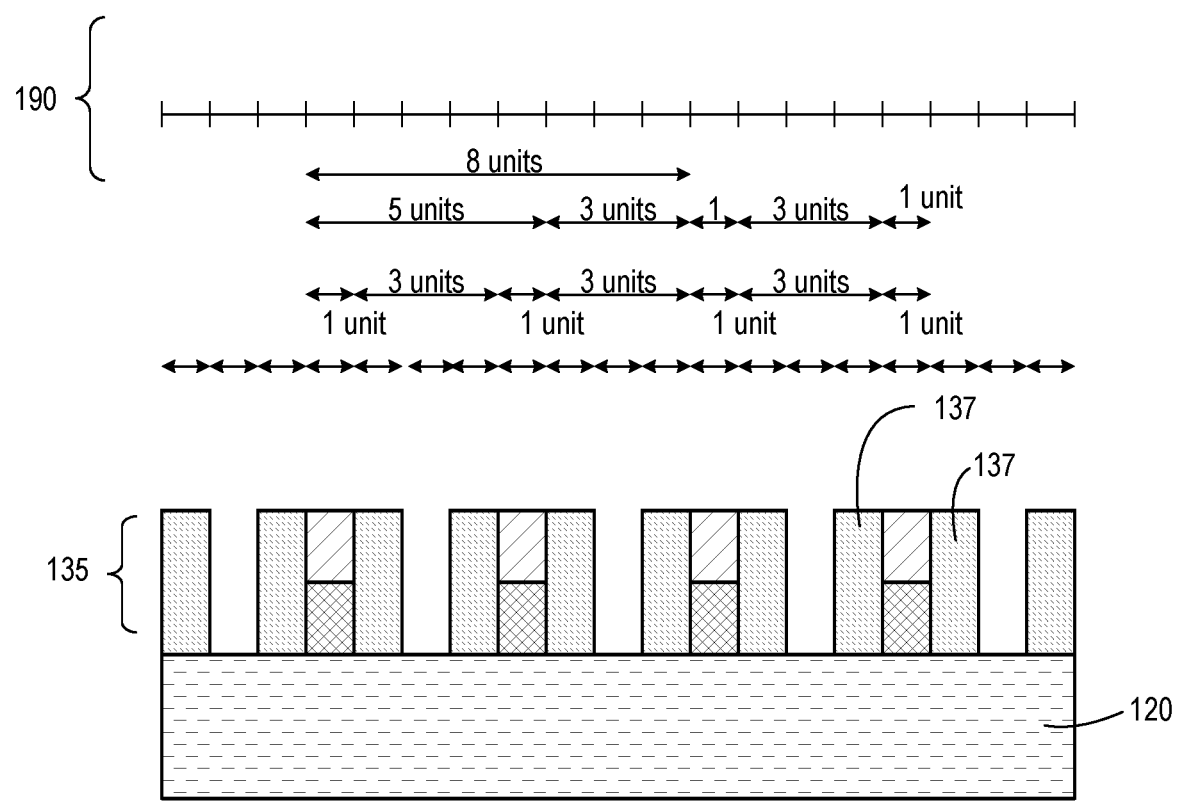
FIG. 11 is a cross-sectional view of an example substrate segment showing a process flow according to embodiments disclosed herein.

The conformal deposition can be followed by a spacer open etch to remove spacer material (such as silicon dioxide) from horizontal surfaces. An example result is shown in FIG. 11, which shows sidewall spacers 137 now on two-layer mandrels, with spaces between sidewall spacers.

Figure 12:
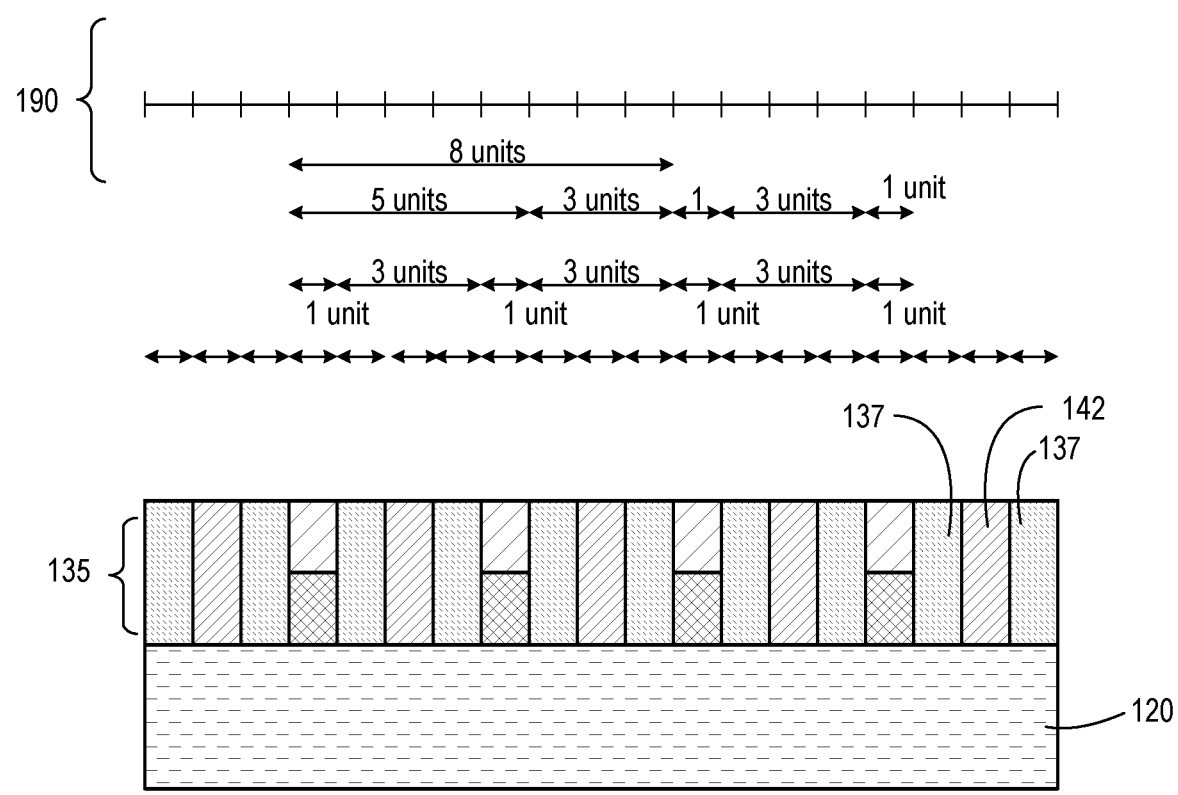
FIG. 12 is a cross-sectional view of an example substrate segment showing a process flow according to embodiments disclosed herein.

A second fill material can then be deposited on the substrate. FIG. 12 illustrates fill material 142 filling spacers between sidewall spacers 137. An example fill material is spin-on amorphous carbon overfill or organic planarization layer. Any overburden from deposition can be etched back to uncover sidewall spacers and mandrels.

Figure 13:
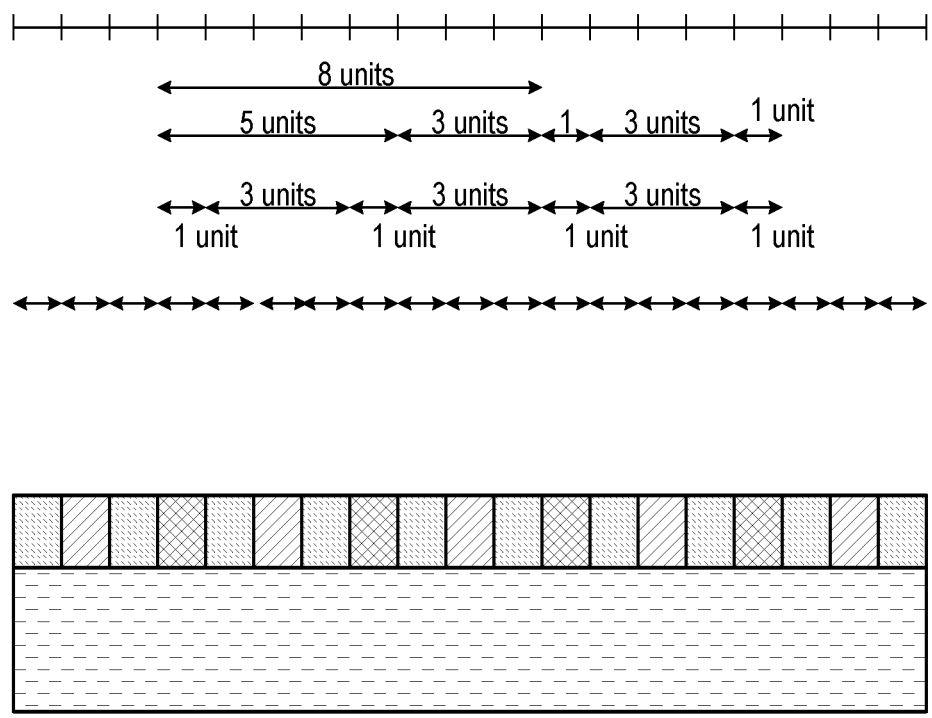
FIG. 13 is a cross-sectional view of an example substrate segment showing a process flow according to embodiments disclosed herein.

The substrate is then planarized by chemical-mechanical polishing (CMP). The lower layer of the two-layer/bi-layer mandrel can be selected as a CMP stop material, such as silicon nitride. A CMP stop material is a material that resists CMP planarization and functions as an effective material for stopping a CMP process. An example result is shown in FIG. 13. Note that the resulting pattern on the substrate can be a multi-line layer having a planar top surface and a repeating pattern of materials of different etch resistivities, without any top rounding of materials. Alternatively, the substrate can be etched to expose the hardmask mandrel. The result can be alternating lines of amorphous carbon and SiN with spacer silicon oxide in between.

Figure 14:
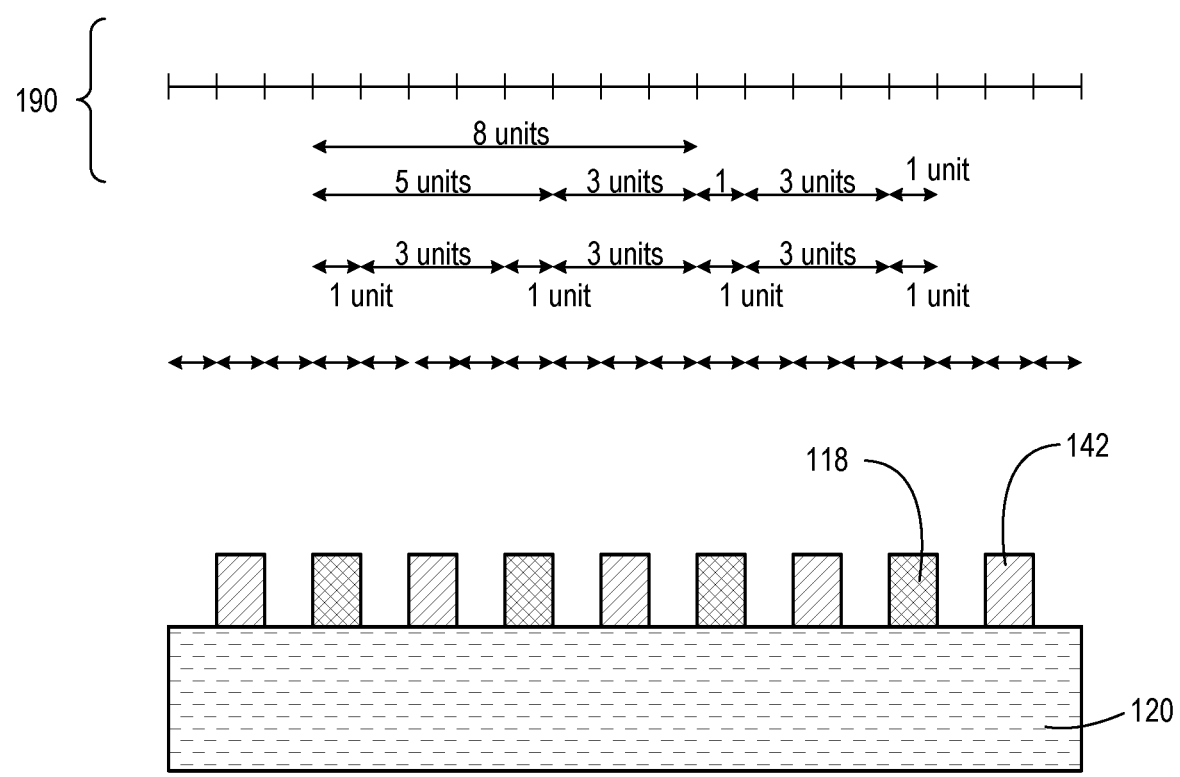
FIG. 14 is a cross-sectional view of an example substrate segment showing a process flow according to embodiments disclosed herein.

Any further steps can be continued from this point. For example, spacer oxide material can be removed via etch (FIG. 14). Alternatively, the CMP stop material and fill material 142 can both be removed, leaving a pattern of lines and spaces at a 1:1 ratio, all of a same material. In another option, an etch mask can be formed on top of the multi-line layer, and/or the pattern can be transferred into an underlying poly silicon layer.

Accordingly, one embodiment includes a method of patterning a substrate. A substrate is received or formed having a first relief pattern positioned on a stack of underlying layers. The first relief pattern includes linear structures having three layers of material. The three layers of material include a layer of photoresist positioned on an anti-reflective coating layer. The anti-reflective coating layer is positioned on a third layer. The linear structures can have a first pitch that has a line-to-space ratio of 5:3 in that lines have a cross-sectional line width of five units while spaces have a cross-sectional space width of three units.

A first etch operation is executed. This etch operation is isotropic or non-directional and uses chemistry that selectively etches the layer of photoresist without etching the anti-reflective coating layer, without etching the third layer, and without etching the stack of underlying layers. This isotropic etch operation results in the layer of photoresist being, at least, laterally etched from an initial width of lines to a resulting width of lines. Height can also decrease with uniform etching. The resulting width of lines is less than the initial width of lines. This layer of photoresist can be laterally etched such that a resulting width of lines of photoresist is equal to three fifths of an initial width of lines of photoresist.

A fill material is deposited on the substrate that fills spaces between structures of the first relief pattern, covers horizontal top surfaces of the anti-reflective coating layer, and leaves top surfaces of the layer of photoresist uncovered. Depositing the fill material can include multiple steps. For example, depositing the fill material can result in an overburden of material, that completely covers the substrate and structures thereon. The overburden, or amount above top surfaces of structures, can be removed by an etch back process or acid based diffusion process. A solubility-changing agent can be diffused a predetermined depth into the fill material from a top surface of the fill material, rendering this portion soluble to a particular solvent. Diffusion can be driven by heat or light. Soluble portions of the fill material can then be developed (removed) thereby uncovering top surfaces of the layer of photoresist.

A second etch operation is executed that removes the layer of photoresist and anisotropically etches uncovered portions of the anti-reflective coating layer and the third layer. This essentially forms a trench within a mandrel/line. The fill material is removed from the substrate. A pattern defined by remaining portions of the third layer is transferred into a fourth layer and into a fifth layer, using the third layer and second layer as an etch mask. The fourth layer is positioned below the third layer, and the fifth layer positioned below the fourth layer. This pattern transfer results in the fourth layer and the fifth layer forming bi-layer mandrels. Sidewall spacers are then formed on the bi-layer mandrels. A second fill material can be deposited on the substrate that at least partially fills spaces defined between the sidewall spacers on the bi-layer mandrels, the second fill material being greater in height as compared to the fifth layer. In other words, the second fill material is at least as thick as the fifth layer. This second fill can also initially be an overburden deposition that is recessed or etched back. The substrate is then planarized by removing the fourth layer and removing material from the sidewall spacers and the second fill material down to a top surface of the fifth layer such that a multi-line layer is formed having a planar surface at the top surface of the fifth layer. The fifth layer can be selected as a material resistant to chemical-mechanical planarization. Additional steps can optionally be executed. The sidewall spacers can be removed from the multi-line layer. An etch mask can be formed on the multi-line layer. This etch mask defines openings that uncover segments of all lines of the multi-line layer, and then uncovered portions of at least one material from the multi-line layer can be etched. A sixth layer positioned under the multi-line layer can be etched using the multi-line layer and the etch mask as a combined etch mask.

Another embodiment includes a method of patterning a substrate. A first relief pattern is formed on a stack of underlying layers on a substrate. The first relief pattern includes linear structures having three layers of material. The three layers of material include a first layer positioned on a second layer, and the second layer positioned on a third layer. The linear structures are formed at a first pitch that has a line-to-space ratio of 5:3 in that lines have a cross-sectional line width of five units while spaces have a cross-sectional space width of three units.

A first etch operation is executed that is isotropic and uses chemistry that selectively etches the first layer without etching the second layer, without etching the third layer, and without etching the stack of underlying layers. The isotropic etch operation results in the first layer being laterally etched resulting in the cross-sectional line width of five units being trimmed to a second cross-sectional line width of three units. A fill material is deposited on the substrate that fills spaces between structures of the first relief pattern, covers horizontal top surfaces of the second layer, but leaves top surfaces of the first layer uncovered. There can initially be an overburden that is removed, or a bottom-up fill can be used. A second etch operation is executed that removes the first layer and anisotropically etches uncovered portions of the second layer and the third layer. The fill material can be removed from the substrate and then a pattern defined by remaining portions of the third layer is transferred into a fourth layer and a fifth layer. The fourth layer is positioned below the third layer, the fifth layer is positioned below the fourth layer, resulting in the fourth layer and the fifth layer forming bi-layer mandrels having a second pitch that has a second line-to-space ratio of 1:3 in that bi-layer mandrels have a second cross-sectional line width of one unit while spaces defined between bi-layer mandrels have a second cross-sectional space width of three units. The fifth layer can be selected as a material resistant to chemical-mechanical planarization.

Sidewall spacers can be formed on the bi-layer mandrels. A second fill material is deposited on the substrate that at least partially fills spaces defined between the sidewall spacers on the bi-layer mandrels. The second fill material is greater in height as compared to the fifth layer. The substrate is planarized by removing the fourth layer and removing material from the sidewall spacers and the second fill material down to a top surface of the fifth layer such that a multi-line layer is formed having a planar surface at the top surface of the fifth layer. Sidewall spacers can be removed from the multi-line layer. Remaining lines on the multi-line layer have a third line-to-space ratio of 1:1 in that each remaining line is one unit wide while each remaining space is one unit wide. An additional etch mask can be formed on the multi-line layer defining openings that uncover segments of all lines of the multi-line layer. Uncovered portions of at least one material can be etched from the multi-line layer. A sixth layer positioned under the multi-line layer can be etched with the multi-line layer and the etch mask used as a combined etch mask.

Another embodiment includes a method of patterning a substrate. A substrate is received having a first relief pattern formed on a stack of underlying layers. This substrate can be received in a semiconductor processing tool, such as an etch chamber. It can be received after forming and patterning layers using various semiconductor manufacturing tools such as coater-developer, furnace, scanner, plasma-based etch, and deposition tools. The first relief pattern includes linear structures having at least two layers of material. The two layers of material include a first layer positioned on a second layer. The linear structures have a first pitch that has a line-to-space ratio of 5:3 in that lines have a cross-sectional line width of five units while spaces have a cross-sectional space width of three units.

A first etch operation is executed that is isotropic and uses chemistry that selectively etches the first layer without etching the second layer and without etching the stack of underlying layers. The isotropic etch operation results in the first layer being at least laterally etched from an initial width of lines to a resulting width of lines, the resulting width of lines being less than the initial width of lines. A resulting width of lines of the first layer is equal to three fifths of an initial width of lines of the first layer.

A fill material is deposited on the substrate that fills spaces between structures of the first relief pattern and covers horizontal top surfaces of the second layer, but leaves top surfaces of the first layer. A second etch operation is executed that removes the first layer and anisotropically etches uncovered portions of the second layer. The fill material is removed from the substrate and then a pattern defined by remaining portions of the second layer is transferred into a third layer. The third layer is positioned below the second layer, resulting in the third layer forming mandrels for sidewall spacers. Sidewall spacers can be formed on the mandrels, and then the mandrels can be removed from the substrate.

Note that various materials can be used for a given layer. Example materials can include photoresist, silicon-containing anti-reflective coating, SiON, amorphous carbon, silicon nitride, silicon oxide, hardmask materials, and metal-containing materials, such as titanium nitride. Also note that many variations of techniques are contemplated herein. For example, the initial relief pattern can have two layers instead of three. The top layer is then slimmed to define a width to remove from the underlying mandrel. In other words, to define a trench to form within a line to increase pitch density.

Accordingly, techniques herein provide desirable pitch spacing and square spacer profiles to improve LER and LWR.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments. Labels such as "first," "second," et cetera, may be used to distinguish elements and processes. Note that these are merely labels and do not convey position, order, sequence, and so forth unless explicitly indicated or apparent from dependency.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
    receiving a substrate having a first relief pattern formed on a stack of underlying layers, the first relief pattern includes linear structures having three layers of material, the three layers of material include a layer of photoresist positioned on an anti-reflective coating layer, the anti-reflective coating layer positioned on a third layer;
    executing a first etch operation that is isotropic and uses chemistry that selectively etches the layer of photoresist without etching the anti-reflective coating layer, without etching the third layer, and without etching the stack of underlying layers, wherein the isotropic etch operation results in the layer of photoresist being at least laterally etched from an initial width of lines to a resulting width of lines, the resulting width of lines being less than the initial width of lines;
    depositing a fill material on the substrate that fills spaces between structures of the first relief pattern, covers horizontal top surfaces of the anti-reflective coating layer, and leaves top surfaces of the layer of photoresist uncovered;
    executing a second etch operation that removes the layer of photoresist and anisotropically etches uncovered portions of the anti-reflective coating layer and the third layer;
    removing the fill material from the substrate and then transferring a pattern defined by remaining portions of the third layer into a fourth layer and into a fifth layer, the fourth layer positioned below the third layer, the fifth layer positioned below the fourth layer, transferring the pattern resulting in the fourth layer and the fifth layer forming bi-layer mandrels;
    forming sidewall spacers on the bi-layer mandrels;
    depositing a second fill material on the substrate that at least partially fills spaces defined between the sidewall spacers on the bi-layer mandrels, the second fill material being greater in height as compared to the fifth layer; and
    planarizing the substrate by removing the fourth layer, and removing material from the sidewall spacers and the second fill material down to a top surface of the fifth layer such that a multi-line layer is formed having a planar surface at the top surface of the fifth layer.

2. The method of claim 1, wherein the linear structures have a first pitch that has a line-to-space ratio of 5:3 in that lines have a cross-sectional line width of five units while spaces have a cross-sectional space width of three units.

3. The method of claim 1, wherein the layer of photoresist is laterally etched such that a resulting width of lines of photoresist is equal to three fifths of an initial width of lines of photoresist.

4. The method of claim 1, wherein depositing the fill material results in an overburden of fill material that is removed by a fill material etch back process.

5. The method of claim 1, wherein depositing the fill material results in an overburden of fill material that is removed by diffusing a solubility-changing agent a predetermined depth into the fill material from a top surface of the fill material, and removing soluble portions of the fill material thereby uncovering top surfaces of the layer of photoresist.

6. The method of claim 1, wherein the fifth layer is selected as a material resistant to chemical-mechanical planarization.

7. The method of claim 1, further comprising removing the sidewall spacers from the multi-line layer.

8. The method of claim 1, further comprising forming an etch mask on the multi-line layer, the etch mask defining openings that uncover segments of all lines of the multi-line layer.

9. The method of claim 8, further comprising etching uncovered portions of at least one material from the multi-line layer.

10. The method of claim 9, further comprising etching a sixth layer positioned under the multi-line layer, wherein the multi-line layer and the etch mask are used as a combined etch mask.

11. A method of patterning a substrate, the method comprising:
    forming a first relief pattern on a stack of underlying layers on a substrate, the first relief pattern includes linear structures having three layers of material, the three layers of material include a first layer positioned on a second layer, the second layer positioned on a third layer, wherein the linear structures are formed at a first pitch that has a line-to-space ratio of 5:3 in that lines have a cross-sectional line width of five units while spaces have a cross-sectional space width of three units;
    executing a first etch operation that is isotropic and uses chemistry that selectively etches the first layer without etching the second layer, without etching the third layer, and without etching the stack of underlying layers, wherein the isotropic etch operation results in the first layer being laterally etched resulting in the cross-sectional line width of five units being trimmed to a second cross-sectional line width of three units;

depositing a fill material on the substrate that fills spaces between structures of the first relief pattern, covers horizontal top surfaces of the second layer, but leaves top surfaces of the first layer uncovered;

executing a second etch operation that removes the first layer and anisotropically etches uncovered portions of the second layer and the third layer; and removing the fill material from the substrate and then transferring a pattern defined by remaining portions of the third layer into a fourth layer and a fifth layer, the fourth layer positioned below the third layer, the fifth layer positioned below the fourth layer, resulting in the fourth layer and the fifth layer forming bi-layer mandrels having a second pitch that has a second line-to-space ratio of 1:3 in that the bi-layer mandrels have a second cross-sectional line width of one unit while spaces defined between bi-layer mandrels have a second cross-sectional space width of three units.

12. The method of claim 11, further comprising:

forming sidewall spacers on the bi-layer mandrels;

depositing a second fill material on the substrate that at least partially fills spaces defined between the sidewall spacers on the bi-layer mandrels, the second fill material being greater in height as compared to the fifth layer; and planarizing the substrate by removing the fourth layer, and removing material from the sidewall spacers and the second fill material down to a top surface of the fifth layer such that a multi-line layer is formed having a planar surface at the top surface of the fifth layer.

13. The method of claim 11, wherein depositing the fill material results in an overburden of fill material that is removed by a fill material etch back process.

14. The method of claim 11, wherein depositing the fill material results in an overburden of fill material that is removed by diffusing a solubility-changing agent a predetermined depth into the fill material from a top surface of the fill material, and removing soluble portions of the fill material thereby uncovering top surfaces of the first layer.

15. The method of claim 11, wherein the fifth layer is selected as a material resistant to chemical-mechanical planarization.

16. The method of claim 12, further comprising removing the sidewall spacers from the multi-line layer, remaining lines on the multi-line layer having a third line-to-space ratio of 1:1 in that each remaining line is one unit wide while each remaining space is one unit wide.

17. The method of claim 12, further comprising:

forming an etch mask on the multi-line layer, the etch mask defining openings that uncover segments of all lines of the multi-line layer;

etching uncovered portions of at least one material from the multi-line layer; and etching a sixth layer positioned under the multi-line layer, wherein the multi-line layer and the etch mask are used as a combined etch mask.

18. A method for patterning a substrate, the method comprising:

receiving a substrate having a first relief pattern formed on a stack of underlying layers, the first relief pattern includes linear structures having at least two layers of material, the two layers of material include a first layer positioned on a second layer;

executing a first etch operation that is isotropic and uses chemistry that selectively etches the first layer without etching the second layer and without etching the stack of underlying layers, wherein the isotropic etch operation results in the first layer being at least laterally etched from an initial width of lines to a resulting width of lines, the resulting width of lines being less than the initial width of lines;

depositing a fill material on the substrate that fills spaces between structures of the first relief pattern and covers horizontal top surfaces of the second layer, but leaves top surfaces of the first layer;

executing a second etch operation that removes the first layer and anisotropically etches uncovered portions of the second layer;

removing the fill material from the substrate and then transferring a pattern defined by remaining portions of the second layer into a third layer, the third layer positioned below the second layer, resulting in the third layer forming mandrels for sidewall spacers;

forming sidewall spacers on the mandrels; and removing the mandrels from the substrate.

19. The method of claim 18, wherein the linear structures have a first pitch that has a line-to-space ratio of 5:3 in that lines have a cross-sectional line width of five units while spaces have a cross-sectional space width of three units.

20. The method of claim 19, wherein the first layer is laterally etched such that the resulting width of lines of the first layer is equal to three fifths of the initial width of lines of the first layer.

* * * * *